United States Patent
Hodges et al.

(10) Patent No.: US 10,373,549 B2
(45) Date of Patent: *Aug. 6, 2019

(54) DISPLAY ON A STRETCHABLE SUBSTRATE

(71) Applicant: Microsoft Technology Licensing, LLC, Redmond, WA (US)

(72) Inventors: Stephen Edward Hodges, Cambridge (GB); Nicholas Yen-Cherng Chen, Cambridge (GB); David Sweeney, Cambridge (GB); Anja Thieme, Cambridge (GB); Tobias Grosse-Puppendahl, Cambridge (GB); Helene Steiner, Cambridge (GB)

(73) Assignee: Microsoft Technology Licensing, LLC, Redmond, WA (US)

(*) Notice: Subject to any disclaimer, the term of this patent is extended or adjusted under 35 U.S.C. 154(b) by 1 day.

This patent is subject to a terminal disclaimer.

(21) Appl. No.: 15/922,898

(22) Filed: Mar. 15, 2018

(65) Prior Publication Data

US 2018/0204504 A1    Jul. 19, 2018

Related U.S. Application Data

(63) Continuation of application No. 15/257,865, filed on Sep. 6, 2016, now Pat. No. 9,947,262.

(30) Foreign Application Priority Data

Jun. 6, 2016  (GB) .................... 1609875.8

(51) Int. Cl.
*B32B 3/26* (2006.01)
*G06F 1/16* (2006.01)
(Continued)

(52) U.S. Cl.
CPC ........... *G09G 3/2092* (2013.01); *B32B 3/266* (2013.01); *G06F 1/1652* (2013.01);
(Continued)

(58) Field of Classification Search
CPC .......... B32B 2307/202; B32B 2457/20; B32B 2255/00; B32B 3/266; H01L 27/1446;
(Continued)

(56) References Cited

U.S. PATENT DOCUMENTS 8,780,240 B2    7/2014  Posch et al.
2001/0028352 A1  10/2001  Naegle et al.
(Continued)

OTHER PUBLICATIONS

"Notice of Allowance Issued in U.S. Appl. No. 15/257,865", dated Dec. 7, 2017, 11 Pages.
(Continued)

*Primary Examiner* — Muhammad N Edun (57) ABSTRACT

A display comprises a plurality of autonomous pixels on a stretchable substrate. Each autonomous pixel comprises a display element and a control element arranged to sense an external stimulus and to generate, entirely within the autonomous pixel, a control signal to drive the display element based, at least in part, on a magnitude of the sensed external stimulus. The stretchable substrate comprises a plurality of less elastic regions separated by stretchable areas, where the less elastic regions are less stretchable than the surrounding stretchable areas and each control element of an autonomous pixel is located in or on a less elastic region of the stretchable substrate.

20 Claims, 5 Drawing Sheets

(51) Int. Cl.
*G09G 3/20* (2006.01)
*H01L 27/12* (2006.01)
*H01L 31/10* (2006.01)
*H01L 31/14* (2006.01)
*H01L 27/144* (2006.01)

(52) U.S. Cl.
CPC ....... *G09G 3/2088* (2013.01); *H01L 27/1218* (2013.01); *H01L 27/1446* (2013.01); *B32B 2255/00* (2013.01); *B32B 2307/202* (2013.01); *B32B 2457/20* (2013.01); *G09G 2300/0469* (2013.01); *G09G 2360/141* (2013.01); *H01L 31/10* (2013.01); *H01L 31/14* (2013.01); *H01L 2251/5338* (2013.01)

(58) Field of Classification Search
CPC ..... H01L 27/1218; H01L 31/10; H01L 31/14; G09G 3/2092; G09G 2300/0469
See application file for complete search history.

(56) References Cited

U.S. PATENT DOCUMENTS

| | | | |
|---|---|---|---|
| 2002/0094701 | A1 | 7/2002 | Biegelsen et al. |
| 2008/0043003 | A1 | 2/2008 | Vogsland |
| 2010/0001933 | A1 | 1/2010 | Coker et al. |
| 2010/0026838 | A1 | 2/2010 | Belenky et al. |
| 2010/0194704 | A1 | 8/2010 | Koito et al. |
| 2010/0317132 | A1 | 12/2010 | Rogers et al. |
| 2013/0016125 | A1 | 1/2013 | Mainguet |
| 2016/0028043 | A1 | 1/2016 | Kwon et al. |
| 2016/0049602 | A1 | 2/2016 | Kim |
| 2016/0088088 | A1 | 3/2016 | Van et al. |
| 2016/0163253 | A1 | 6/2016 | Chaji et al. |
| 2017/0040306 | A1 | 2/2017 | Kim et al. |
| 2017/0301266 | A1 | 10/2017 | Zhang et al. |

OTHER PUBLICATIONS

Barker, et al., "Interactive Polymedia Pixel and Protocol for Collaborative Creative Content Generation on Urban Digital Media Displays", In Proceedings of Conference on New Media and Interactivity, Apr. 28, 2010, 7 Pages.

"International Search Report and Written Opinion Issued in PCT Application No. PCT/US2017/034904", dated Aug. 25, 2017, 10 Pages.

Posch, et al., "An Asynchronous Time-based Image Sensor", In Proceedings of IEEE International Symposium on Circuits and Systems, May 18, 2008, pp. 2130-2133.

Sweeney, et al., "Displays as a Material: A Route to Making Displays More Pervasive", In Journal of IEEE Pervasive Computing, vol. 15, Issue 3, Jul. 2016, pp. 77-82.

Sweeney, et al., "Disruptive Displays", https://hxd.research.microsoft.com/work/disruptive-displays.php, Sep. 7, 2015, 3 Pages.

Thieme, et al., "Body Covers as Digital Display: A New Material for Expressions of Body & Self", In Proceedings of the 2016 ACM International Joint Conference on Pervasive and Ubiquitous Computing: Adjunct, Sep. 12, 2016, 6 Pages.

DISPLAY ON A STRETCHABLE SUBSTRATE

CROSS REFERENCE TO RELATED APPLICATIONS

This application is a continuation of and claims priority to U.S. application Ser. No. 15/257,865, entitled "A DISPLAY ON A STRETCHABLE SUBSTRATE," filed Sep. 6, 2016, which claims priority to GB Application No. 1609875.8, both of which are incorporated by reference herein in their entireties.

BACKGROUND

Current displays use complex electronics, row/column drivers for the pixels and timing circuitry in order to render images on the display. Use of row/column drivers makes it difficult to construct displays on non-developable surfaces. A developable surface is one which can be flattened onto a plane without distortion and hence a non-developable surface (such as a spherical surface) is one which cannot be flattened onto a plane without distortion. This is similar to the problem experienced when projecting maps of the globe onto a plane.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

A display comprises a plurality of autonomous pixels on a stretchable substrate. Each autonomous pixel comprises a display element and a control element arranged to sense an external stimulus and to generate, entirely within the autonomous pixel, a control signal to drive the display element based, at least in part, on a magnitude of the sensed external stimulus. The stretchable substrate comprises a plurality of less elastic regions separated by stretchable areas, where the less elastic regions are less stretchable than the surrounding stretchable areas and each control element of an autonomous pixel is located in or on a less elastic region of the stretchable substrate.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

As described above, the use of row/column drivers makes it difficult to construct displays on non-developable surfaces. The use of row/column drivers means that displays typically comprise a regular or rectilinear array of pixels. The embodiments described below are not limited to implementations which solve any or all of the disadvantages of known displays.

Described herein are displays which are formed from a plurality of autonomous, self-contained pixels on a stretchable substrate, where the term 'stretchable' is used to mean that the substrate is capable of being made longer and/or wider without tearing or breaking. The substrate may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the display (e.g. with the display being stretched and optionally flexed to form its final shape), during assembly of a device incorporating the display (which may be considered part of the manufacturing operation) and/or during use (e.g. with the user being able to stretch and optionally flex the display). The substrate comprises a plurality of less elastic regions where at least parts of autonomous pixels are located (i.e. each less elastic region of the substrate comprises part of a single autonomous pixel, an entire autonomous pixel or a cluster of autonomous pixels). The less elastic regions of the substrate are less stretchable (or more inelastic) than the parts of the substrate between the less elastic regions (e.g. between the autonomous pixels), such that if a force is applied to deform the stretchable substrate, the parts of the substrate between the less elastic regions stretch (or deform) significantly more than the less elastic regions (where at least parts of the autonomous pixels are located).

By having a substrate with variable stretchiness, as described above, and with at least certain parts of the autonomous pixel being located in the less elastic regions, the performance of the autonomous pixels remains substantially the same even when the substrate is stretched (e.g. as a result of the spatial relationship of components being maintained) and the probability that an autonomous pixel will fail when the substrate is stretched is reduced. This increases the robustness and reliability of the display and, where the stretching occurs during manufacture of the display, increases the manufacturing yield.

The pixels are described as autonomous because they operate independently (i.e. without requiring drive signals from central driver circuitry) and the signals which are used to control each pixel (e.g. to control whether it is black or white or grey or to control the color of the pixel where it is a color or grey-scale display) are generated locally, i.e. entirely within the pixel itself. Within a pixel, the control signal is generated based, at least in part, on the output of a sensor device which senses the magnitude (e.g. level or amplitude) of an external stimulus. At least the sensor device and the components which generate the control signal are located in or on a less elastic region of the stretchable substrate. In various examples, the part of the pixel which changes color (referred to herein as the 'display element') may extend beyond the less elastic region or may also be located within a less elastic region (such that the entire autonomous pixel is located in or on a less elastic region of the stretchable substrate).

The external stimulus may comprise ambient signals incident upon the sensor device and/or an applied signal or stimulus which is applied in the region of the pixel itself. In some of the embodiments described below, the only signals or connections which are provided to the pixels in the display are global signals or connections (i.e. such that the same signals or connections are provided to all the pixels in the display), e.g. a global power connection and a global ground connection.

As at least the sensor device and the components which generate the control signal are located in or on a less elastic region of the stretchable substrate, when the substrate is stretched, these components are not significantly distorted and the autonomous pixel's performance will not be changed significantly.

By constructing a display from autonomous, self-contained pixels, the pixels can be arranged in an arbitrary arrangement and are not limited to a regular or rectilinear grid. For example, the pixels may be randomly (or pseudo-randomly) arranged. This enables displays with a constant pixel density across the display to be formed on non-developable surfaces (e.g. such that the pixel density is independent of the topology in a particular region of the display) and the pixel density to be changed by stretching the display. Additionally, as the pixels operate independently, images can be easily rendered onto the display through the provision of the external stimulus. Where this external stimulus comprises visible light, the display may act as a self-developing photographic surface. Using the autonomous pixels described herein, a display can be implemented with minimal electronic components and this may therefore enable a display to be thinner, more flexible, lighter, cheaper and/or easier to manufacture than traditional displays. It can also be fabricated using standard manufacturing techniques.

Any suitable display technology may be used and in many examples, the display may be an electronic paper display. The term 'electronic paper' is used herein to refer to display technologies which reflect light (like paper) instead of emitting light like conventional LCD displays. As they are reflective, electronic paper displays do not require a significant amount of power to maintain an image on the display and so may be described as persistent displays. A multi-stable display is an example of an electronic paper display. In some display devices, an electronic paper display may be used together with light generation in order to enable a user to more easily read the display when ambient light levels are too low (e.g. when it is dark). In such examples, the light generation is used to illuminate the electronic paper display to improve its visibility rather than being part of the image display mechanism and the electronic paper does not require light to be emitted in order to function.

The term 'multi-stable display' is used herein to describe a display which comprises pixels that can move between two or more stable states (e.g. a black state and a white state and/or a series of grey or colored states) and each pixel may therefore be referred to as a 'multi-stable display element' or 'multi-stable pixel'. Bi-stable displays, which comprise pixels having two stable states, are therefore examples of multi-stable displays. A multi-stable display can be updated when powered, but holds a static image when not powered and as a result can display static images for long periods of time with minimal or no external power. Consequently, a multi-stable display may also be referred to as a 'persistent display' or 'persistently stable' display.

Figure 1:
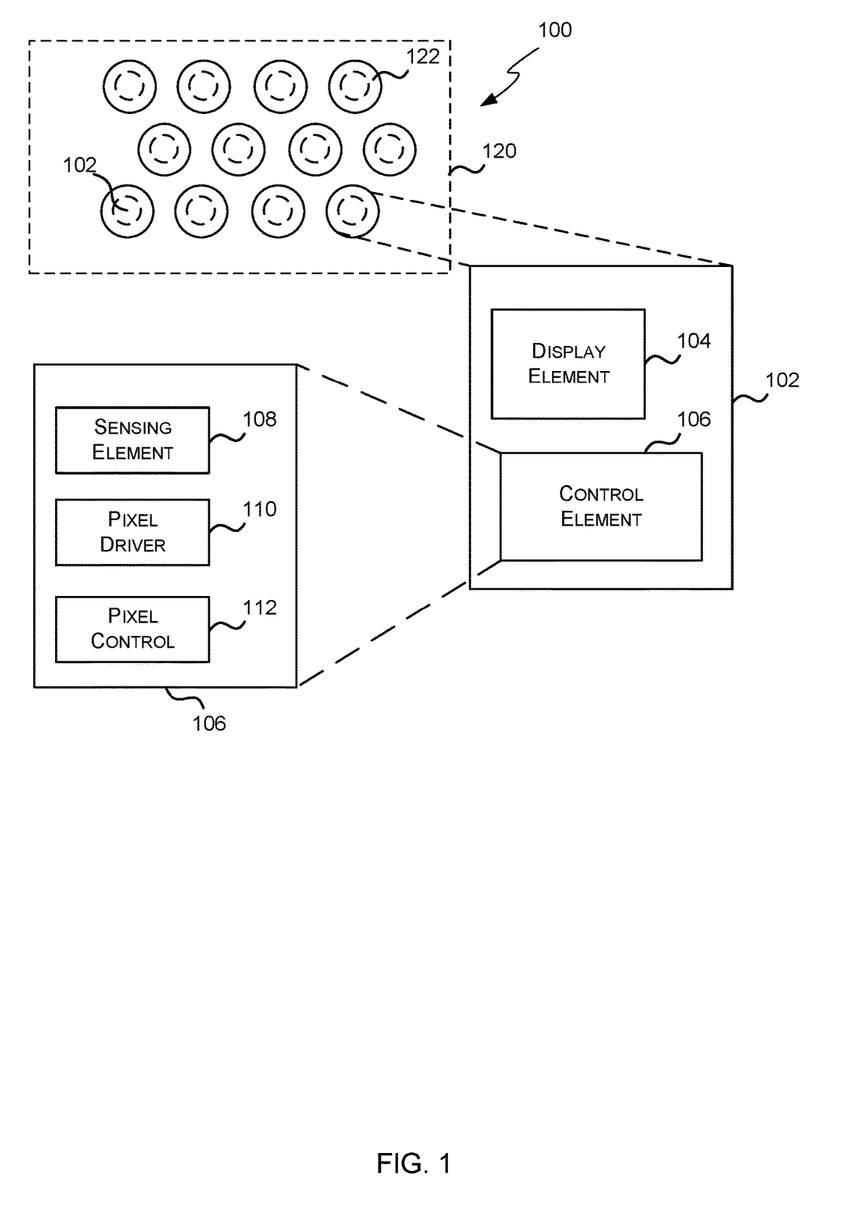
FIG. 1 is a schematic diagram showing a portion of a display comprising a plurality of autonomous pixels formed in or on a differentially stretchable substrate.

FIG. 1 is a schematic diagram showing a part 100 of a display comprising a plurality of autonomous pixels 102. Each autonomous pixel 102 comprises a display element 104 and a control element 106. The display element 104 is an element which can be modified by the control element 106 (e.g. to change its color) in order to display visual information. As described above, each pixel 102 operates autonomously and so comprises its own control element 106 such that signals to control the display element 104 in a particular pixel 102 (e.g. to change the state of the display element) are generated entirely within that pixel 102 (and are not generated in centralized control circuitry).

The display comprises a stretchable substrate 120 which is not of a constant stretchiness, but instead has regions 122 (indicated by the dotted circles in FIG. 1) which are less elastic than the rest of the substrate. At least the control element 106 of each of the autonomous pixels 102 are located on or in the less elastic regions 122 and in some examples (and as shown in FIG. 1), each less elastic region 122 corresponds to (e.g. contains) the control element 106 of a single autonomous pixel 102. As described above, the display element 104 of each autonomous pixel 102 may also be contained within a less elastic region 122 or alternatively may extend beyond the edges of the less elastic region 122. The terms 'region' and 'area' are used synonymously herein to refer to a part of the stretchable substrate 120 (e.g. such that the regions 122 may alternatively be referred to as areas 122).

Although FIG. 1 shows the less elastic regions 122 as being circular in shape, in other examples the less elastic regions 122 may have different shapes and in some examples, not all of the less elastic regions 122 may have the same shape and/or size (e.g. there may be larger less elastic regions comprising an entire autonomous pixel or a group of pixels and smaller less elastic regions, each comprising the control element 106 of a single autonomous pixel).

In various examples, the parts of the stretchable substrate 120 between the less elastic regions 122 may be elastically deformable (i.e. such that when the stretching force is removed, the substrate returns to its original size and shape) and the less elastic regions 122 may stretch less than the other parts of the stretchable substrate 120 when a force is applied. In other examples, the parts of the stretchable substrate 120 between the less elastic regions 122 may be plastically deformable (i.e. such that when the stretching force is removed, the substrate does not return to its original size and shape but instead may remain in a stretched form) and, as before, the less elastic regions 122 may stretch less than the other parts of the stretchable substrate 120 when a force is applied. The term 'stretchable' as used herein encompasses both elastic and plastic deformation.

Figure 5:
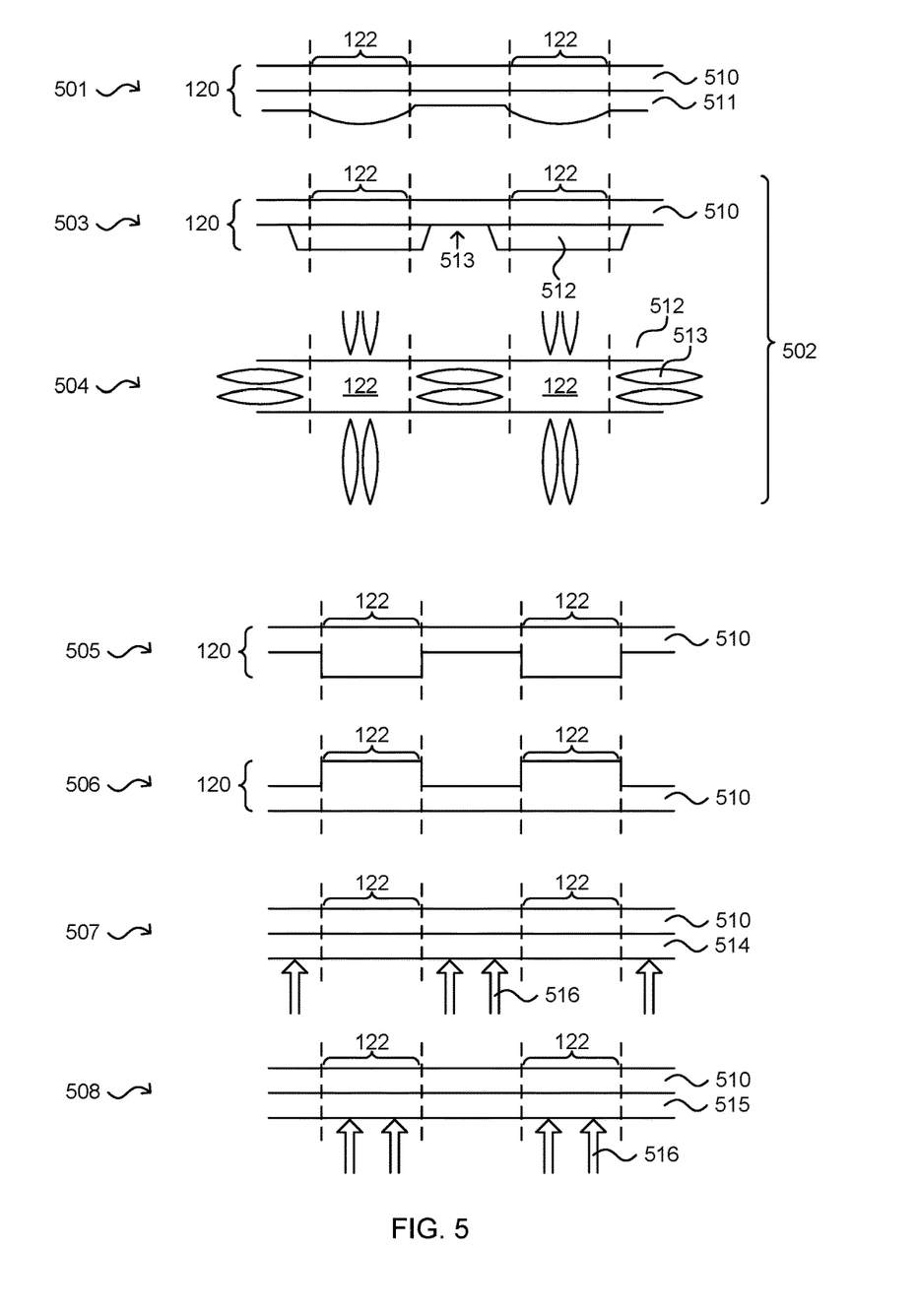
FIG. 5 shows schematic diagrams of the differentially stretchable substrate.

In various examples, the display element 104 is an electronic paper display element (e.g. it may be multi-stable) and may, for example, comprise an e-ink (or similar) bead or a portion of an electrophoretic film with suitable electrodes arranged to move the contained pigment particles. Where a multi-stable film or ink is used, the film or ink may extend across many pixels with the display elements being defined by the arrangement of electrodes (e.g. as shown in FIGS. 5-6 and described below). In another example, a multi-stable display element may comprise an electromechanical activated pixel (e.g. a flip-dot or flip-disc). Other electronic paper display technologies may alternatively be used, such as electrochromic or cholesteric liquid crystal displays. As described above, use of multi-stable display elements allows the display to retain an image once the electrical power required to change the image is removed.

In other examples, however, the display element 104 is not multi-stable and so requires a substantially constant power supply in order to be able to maintain its state (and hence in order that the display can continue to display an image). In such examples, the display element 104 may comprise an LED, OLED, electrowetting display or LCD (although it will be appreciated that there may be ways in which these technologies may also be used to provide a multi-stable display element).

The control element 106 in a pixel is arranged to control the display element 104 (in the same pixel) in response to an external stimulus, i.e. the control element 106 senses an external stimulus and generates a control signal to drive the display element 104 based, at least in part, on the sensed magnitude of the external stimulus. Consequently, the control element 106 may functionally be considered as a combination of a number of different functional elements: a sensing element 108, a pixel driver 110 and a pixel controller 112. Whilst these elements may be functionally distinct, a single electronic component (e.g. a single transistor) or a group of components may be used to carry out more than one of the functions of the sensing element 108, the pixel driver 110 and the pixel controller 112.

The external stimulus may, for example, be visible light (i.e. visible light which is incident upon the display and in particular on the particular pixel 102). In other examples another external stimulus may be used such as other types of radiation (UV, infra-red, X-ray, microwaves, RF, etc., e.g. such that the display may be used to visualize any part of the electromagnetic spectrum), pressure (mechanical, acoustic, vibration, etc.), capacitance, electric and magnetic fields, temperature or chemicals. In all examples, the external stimulus is sensed locally (i.e. within the pixel) and the sensor output is used to control the display element in the pixel. In many of these examples the external stimulus is an analog signal. In some examples the external stimulus is not a digital signal which encodes data (e.g. a WiFi™ or IrDA signal) and hence in these examples the control element 106 does not generate the control signal based on decoded data from the sensed external stimulus but instead generates the control signal based, at least in part, on the magnitude (or level) of the sensed external stimulus. It will be appreciated that some of these external stimuli are not visible (e.g. infra-red) and so enable covert printing or rendering (i.e. other viewers cannot see the image before it is rendered on the display).

The sensing element (or sensor) 108 senses the local environment and in particular the external stimulus and different sensing elements 108 may be used to detect different external stimuli. As mentioned above, the external stimulus may comprise ambient signals incident upon the sensor device and/or an applied signal or stimulus which is applied in the region of the pixel itself. In various examples a display (or a pixel 102) may have different operating modes: one where it detects ambient signals and one where it detects an applied signal and the operation of the pixel 102 (e.g. the control element 106) may change between the different modes, for example by using a different threshold in the second mode (that detects an applied signal) or by otherwise removing the background ambient stimulus from the signal in the second mode. In the case of visible light, the sensing element 108 detects the level of incident light upon the pixel 102. The positioning of the sensing element 108 within the pixel (e.g. in relation to the display element 104) may depend on the particular display element and external stimulus used, i.e. whether the display element 104 is opaque to the stimulus being sensed (in which case the display element 104 cannot be between the sensing element 108 and a front surface of the display, i.e. the sensing element 108 cannot be directly behind the display element 104 and may instead be positioned adjacent to the display element) and/or whether the sensing element 108 is opaque to the signal being output by the display element 104 (in which case the sensing element 108 cannot be between the display element 104 and a front surface of the display, i.e. the sensing element 108 cannot be in front of the display element 104 and may instead be positioned adjacent to the display element). The front (or top) surface of the display is used herein to refer to the viewing surface (i.e. the surface on which an image is rendered) and is not intended to limit the possible orientation of the display itself (e.g. in use) which may be horizontal or vertical or at any other orientation and as described herein may be non-planar.

The pixel controller 112 takes input from the sensing element 108 and outputs a local control signal in order to affect the display element 104 in the pixel 102. In various examples, the pixel controller 112 may perform some simple processing of the input signal, such as thresholding, tone mapping, delay effects, signal processing, blending, etc.

Where thresholding is used this may, for example, involve setting a baseline signal level (e.g. based on ambient conditions such as ambient light) so that only the amount of increased signal above the baseline level (e.g. the amount of increased light incident on any given pixel) is used to drive the value of that pixel. Alternatively, a threshold may be used to provide a binary output to the associated pixel, e.g. if the input signal exceeds the threshold level, a 'high' local control signal may be generated (e.g. an 'on' signal) and if the input signal does not exceed the threshold level, a 'low' local control signal may be generated (e.g. an 'off' signal). Tone mapping is a type of thresholding in which the input signal (e.g. the incident light level) is mapped to output colors to display.

Use of delay effects refers to the introduction of a delay between the detection of the external stimulus and the driving of the display and this may, for example, introduce a fixed or variable time delay. Signal processing may be used such that the output is not just a function of the current input but a function such as smoothing (e.g. over time) is implemented. Where blending is used the refers to the control signal taking into account previous sensed data as stored in a buffer or the sensed data from adjacent or nearby pixels.

The pixel driver 110 (which in various examples may be integrated with the pixel controller 112) amplifies the output of the pixel controller 112 and will depend upon the type of technology used for the display element 104. Where the display element 104 is multi-stable, the pixel driver 110 and other elements within the pixel 102 can be powered down once the display element 104 has been updated.

As described above, in various examples a single transistor (or a single transistor with a few other electrical components) may be used to implement the sensing element 108 (e.g. using a photosensitive transistor or relying on an inherent sensitivity of standard transistors), the pixel controller 112 (e.g. as a simple buffer or by performing thresholding) and the pixel driver 110 (e.g. as a transistor inherently amplifies an external input).

In various examples. In other examples, the pixels 102 may be formed separately and attached to the substrate 120 in the less elastic regions 122.

Figure 2:
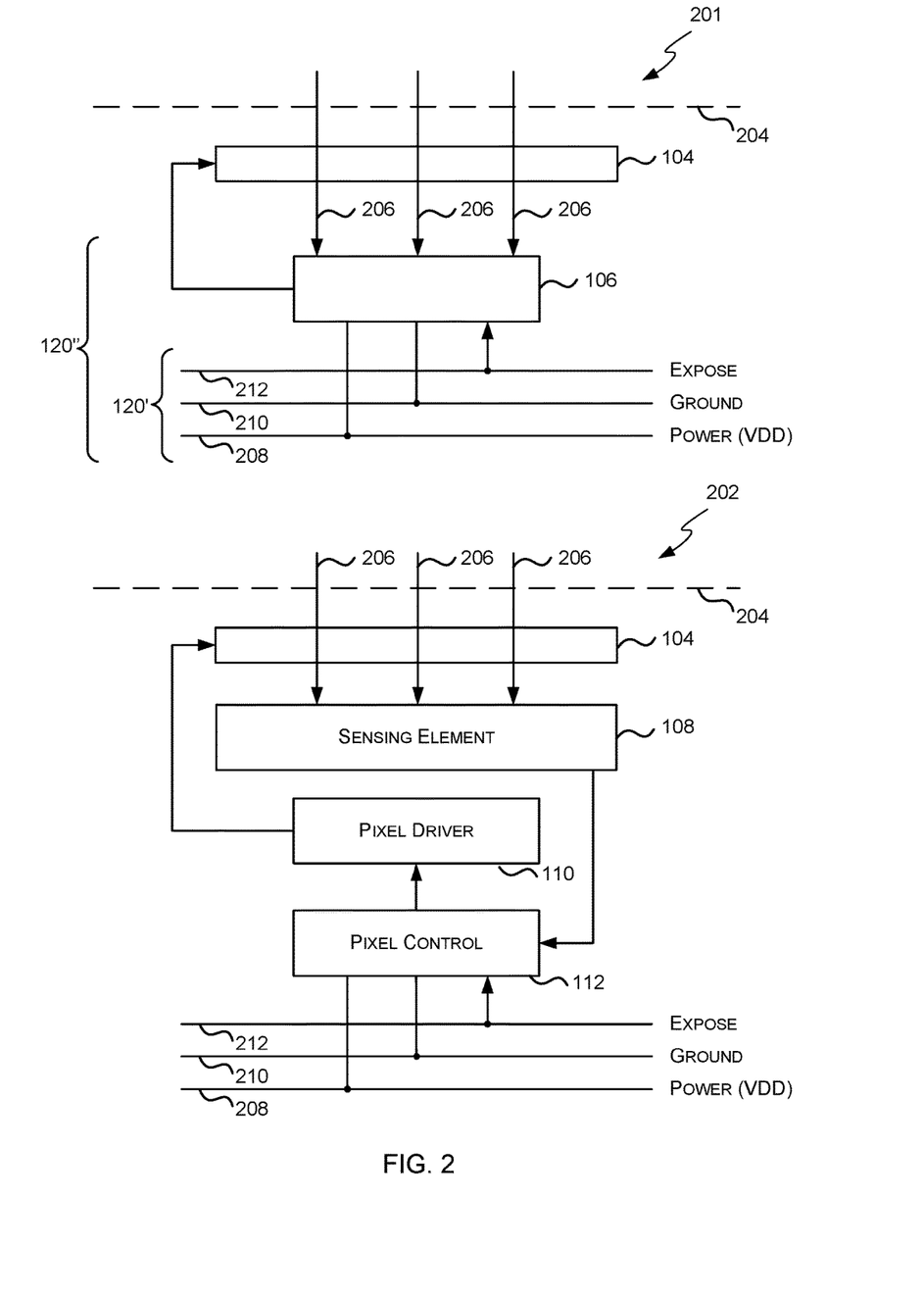
FIG. 2 shows two schematic diagrams of an autonomous pixel such as shown in FIG. 1.

FIG. 2 shows two schematic diagrams 201, 202 of an autonomous pixel 102 in which the component parts 108-112 of the control element 106 are layered behind the display element 104 (with the display face of the autonomous pixel being shown by the dotted line 204). This arrangement (which may be described as a 'vertical stack') relies upon the display element 104 being transparent to the external stimulus 206, so that the stimulus can be detected by the sensing element 108, and enables pixels to be very closely packed together (e.g. because the electronics in each pixel only occupies the area behind the display element) and this is shown in the perspective views in FIG. 3. As described above, in other examples the display element 104 may be adjacent to the control element 106 (or the sensing element 108 within the control element).

In the first diagram 201 in FIG. 2, there is a single control element 106 shown and in the second diagram 202, the functional component parts 108-112 are shown separately. Both diagrams also show the global power rail or plane 208 and the global ground rail or plane 210 to which all the pixels 102 in a display are connected, i.e. these electrical connections are shared throughout the display and in the arrangement shown, each pixel connects to each rail or plane from above (as can also be seen in FIG. 3), e.g. using electrical vias.

By generating control signals locally and only providing global connections to each pixel (e.g. power lines 208, 210 which in the example shown are power and ground) it is not necessary to route signals to individual pixels. By using the vertical stack configuration shown in FIGS. 2 and 3 it is also not necessary to route signals between pixels. Both of these aspects enable pixels to be densely packed together within a display and the use of global connections (e.g. instead of row/column connections) additionally enables displays with uniform pixel density to be formed on non-developable surfaces.

FIG. 2 shows a third, optional, global signal 212 which may be referred to as an 'expose' or 'trigger' signal. This provides a single, common control signal for all pixels 102 in the display which determines the time when each pixel in the display senses the external stimulus (which may also be described as a local stimulus as it is detected separately within each pixel) and uses this information to display a new image pixel, i.e. the expose signal 212 can be used to synchronize (in time) the operation of all the autonomous pixels 102 within a display (and where this may be synchronized with the source of the external stimulus). A global expose signal may, for example, be used to reduce flicker (so that all pixels are updated at the same time) and/or reduce power consumption (so that all pixels update at defined points in time). This can be described with reference to the flow diagram in FIG. 4. The global expose signal may additionally be used to set an exposure level (e.g. for use in thresholding, as described above).

Figure 4:
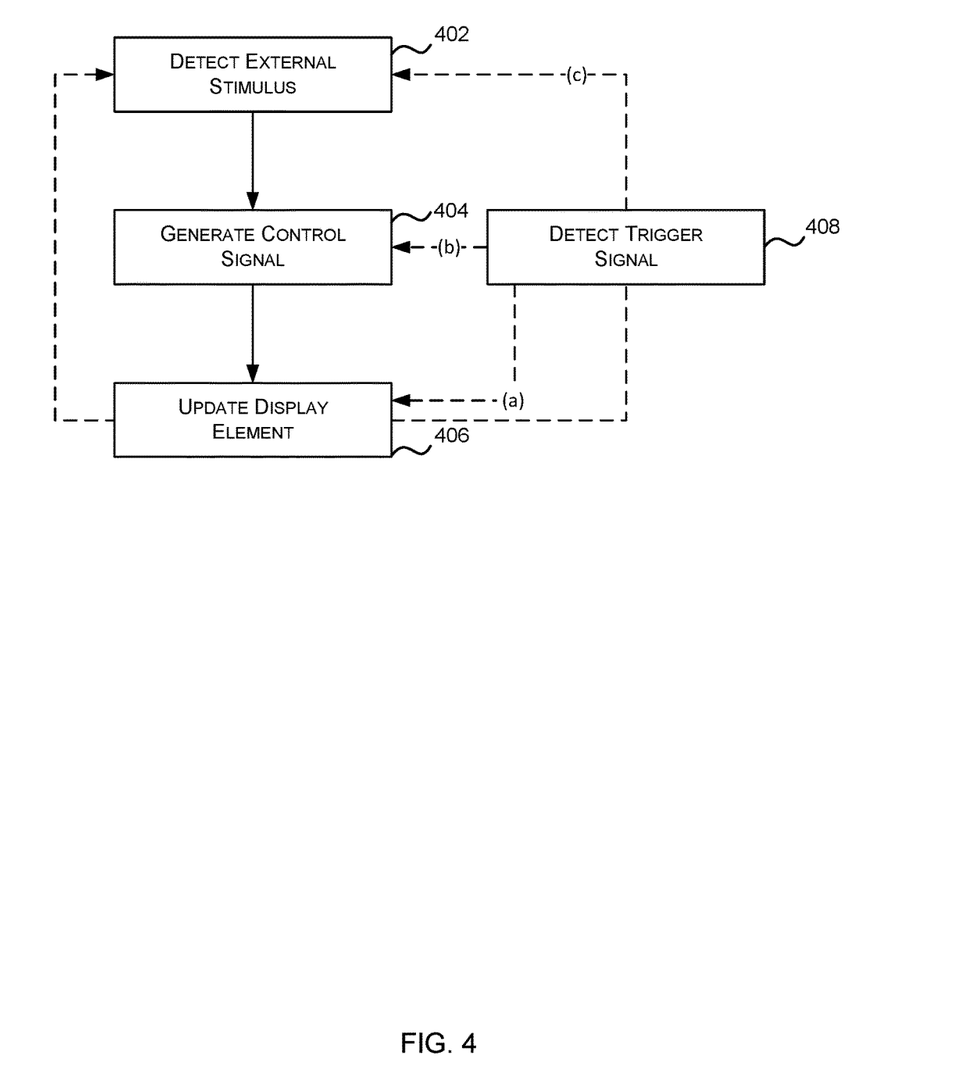
FIG. 4 is a flow diagram showing an example method of operation of an autonomous pixel.

As described above, each pixel 102 detects an external stimulus at the pixel (block 402, e.g. in sensing element 108) and generates a control signal based on the detected stimulus (block 404, e.g. in pixel controller 112). The display element 104 is then updated based on the control signal (block 406), although as will be appreciated, depending on the control signal and the current state of the display element 104, updating the display element (in block 406) may not necessarily result in a change to the display element (e.g. for a bi-stable element which is currently black it may remain black or it may switch to white depending upon the control signal generated).

The global trigger signal 212 may be generated externally to any of the pixels in the display (for example, as is the case for the global power lines 208, 210 which may, for example, be generated by a discrete power supply within the display). Alternatively, the global trigger signal 212 may be generated by one of the autonomous pixels 102 in the display and used by the other autonomous pixels 102 in the display. In such an example, the autonomous pixel 102 which generates the global trigger signal 212 may generate the trigger signal in response to sensing an 'expose' stimulus or in response to a different trigger mechanism. In various examples, more than one or all of the autonomous pixels in the display may be capable of generating the global trigger signal 212 in response to detecting a trigger signal.

In the absence of a global trigger signal, each autonomous pixel 102 in a display may operate independently and different pixels may be updated (in block 406) at different times. However, where a global trigger signal is used (as detected in block 408), each autonomous pixel 102 still operates independently; however the operation of all the pixels in the display is synchronized in time because the update to display (in block 406, arrow (a)), the generation of the control signal (in block 404, arrow (b)) or the sensing (in block 402, arrow (c)) occurs in response to the detection of a trigger signal (in block 408) and all pixels are connected to the same trigger signal 212. Use of a global trigger signal may, for example, enable an image to be rendered onto a display using a single enable bit.

In another example, instead of using a global trigger signal, pixels may be configured to automatically trigger on power-on and in this example, each autonomous pixel may operate independently but in synchronization.

In various examples, the display element 104 and/or control element 106 may be formed in or on the stretchable substrate 120 (e.g. one or more transistors may be formed in layers deposited on or in the substrate). Two different arrangements are indicated by the brackets 120', 120" in the first example 201 in FIG. 2. In the first arrangement 120' only the global connections 208-212 are formed in the stretchable substrate (e.g. with the global connections being formed from a stretchable conductive material) and in the second arrangement 120" the control element 106 (which, as described above, may be implemented as a single transistor) is additionally formed within the stretchable substrate (although this control element 106 will be located within a less elastic region).

There are many different ways by which the variable properties of the stretchable substrate can be achieved and various examples are described below with reference to FIG. 5. In some examples described herein, the substrate may be pre-processed (i.e. such that the variability in stretchiness is achieved prior to the application of the pixels or the transistors within a pixel) and in other examples the substrate may be post-processed (i.e. such that the variability in stretchiness is achieved after the application of the pixels or the transistors within a pixel). Irrespective of whether the substrate is pre- or post-processed, the substrate initially has substantially uniform stretchiness and then it is selectively processed to make regions where the control elements 106 are (or will be) located resistant to stretching and/or to make regions in between where pixels are (or will be) located more easily stretched. In other examples, however, the variable properties of the stretchable substrate may be achieved through use of non-homogenous materials, i.e. such that the less elastic regions are formed from a different material from the surrounding stretchable areas.

In many examples, the less elastic regions 122 of the stretchable substrate 120 are thicker than the parts of the substrate 120 between the less elastic regions, e.g. as shown in examples 501-506 in FIG. 5. In other examples, the differential stretchiness of the substrate 120 may be achieved by coating the substrate with a material which changes its stretchiness when exposed to light, UV or heat (where the light or UV or heat may cause the stretchiness to increase or reduce), e.g. as shown in examples 507-508 in FIG. 5. In yet further examples, the substrate 120 may itself be formed from a material which changes its stretchiness when exposed to light, UV or heat.

In the first example 501 shown in FIG. 5, the differential stretchiness of the substrate 120 is achieved through the addition of a structure 511 which has a variable thickness to a uniformly stretchable layer 510. As shown in FIG. 5, the structure 511 is thicker in the regions 122 where stretching is to be inhibited (i.e. where the autonomous pixels 102 are located) and thinner elsewhere (e.g. in the gaps between pixels 102). The structure 511 with the regions of different thickness may be formed in any suitable way (e.g. using a 2.5D or 3D printer or by etching or ablating a layer of material with constant thickness to form the regions of reduced thickness) and then the structure 511 may be bonded (e.g. using adhesive which may, for example, be heat or UV activated, heat, chemical bonding, ultrasonic welding, etc.) to the uniformly stretchable layer 510 (e.g. onto the underside of that layer 510) to form the substrate 120. In other examples, the structure 511 may be 3D printed directly onto the front or rear surface of the uniformly stretchable layer 510. The substrate 510 may, for example, be formed from silicon, rubber, PPE or PPT and the additional structure 511 may be formed from an inelastic, non-brittle plastic, such as PVC or PET.

In a variation on this first example 501, instead of the additional structure 511 having varying thickness, it may instead be formed from a combination of different materials with regions which corresponding to the less elastic regions (and which are the thicker regions in example 501) being formed from a different material from the surrounding areas (which correspond to the more stretchable areas). Such an additional structure may be formed using a 3D printer which can build objects using a mix of different substances, each having different physical properties.

In the second example 502 shown in FIG. 5, the differential stretchiness of the substrate 120 is achieved through the addition of a structure 512 comprising a plurality of apertures 513 (or holes) to a uniformly stretchable layer 510. This second example 502 is shown in both cross-section 503 and plan view 504 and as shown in FIG. 5, the apertures 513 are not located in the regions 122 where stretching is to be inhibited (i.e. where the autonomous pixels 102 are located) but are instead located in the areas between these less elastic regions 122 (e.g. in the gaps between pixels 102). The apertures 513 may have any suitable shape and may be placed in any suitable arrangement and as well as providing differential stretchiness, the pattern of apertures 513 may also provide differential flexibility of the substrate 120.

The structure 512 with the apertures 513 may be formed in any suitable way (e.g. using a 3D printer or by etching or ablating or cutting or laser-cutting or laser-etching or stamping a layer of material with constant thickness to form the apertures 513) and then the structure 512 may be bonded (e.g. using adhesive) to the uniformly stretchable layer 510 (e.g. onto the underside of that layer 510) to form the substrate 120. In other examples, the structure 512 may be 3D printed directly onto the front or rear surface of the uniformly stretchable layer 510.

Although the first two examples 501, 502 show the additional structures 511, 512 being applied to the underside of the uniformly stretchable layer 510, in other examples the structures may be applied to the top surface or to both surfaces of the uniformly stretchable layer 510.

In the third and fourth examples 505, 506 shown in FIG. 5, the differential stretchiness of the substrate 120 is achieved through the localized removal of material from the top and/or bottom surface of a uniformly stretchable layer 510 to leave a substrate which is thicker in the regions 122 where stretching is to be inhibited (i.e. where the autonomous pixels 102 are located) and thinner elsewhere (e.g. in the gaps between pixels 102). The material may be removed in any suitable way, e.g. by etching or ablating the layer 510.

In a variation of the third and fourth examples the localized removal of material may form a plurality of apertures in the uniformly stretchable layer 510 (e.g. to produce a pattern of apertures similar to that shown in the plan view 504 of the second example). The apertures may be formed in any suitable way, e.g. by etching or ablating the layer 510 or using laser-cutting or laser-drilling.

In the fifth and sixth examples 507, 508 shown in FIG. 5, the differential stretchiness of the substrate 120 is achieved through the application of a layer of material 514, 515 which changes its stretchiness when exposed to light, UV, or heat, or any combination thereof, (where the light or heat or UV may cause the elasticity or stretchiness to increase or reduce). This layer 514, 515 may be applied to the top and/or bottom side of a uniformly stretchable layer 510. For example, the layer of material 514, 515 may be formed from a polymer or rubber which can be hardened through the application of heat or from a material (e.g. a resin) that can be activated (chemically) through the application of heat, UV or light and when activated the stretchiness of the activated regions may increase or reduce.

In the fifth example 507 the additional layer 514 becomes more stretchy when exposed to heat, UV or light, or any combination thereof, (as indicated by arrows 516) to leave regions which preferentially stretch (when compared to the unexposed portions). In contrast, in the sixth example 508 the additional layer 515 becomes less stretchy when exposed to heat, UV or light, or any combination thereof, (as indicated by arrows 516) to leave regions which are less elastic than the surrounding (unexposed) portions. The exposure may be implemented in any suitable way (e.g. by scanning a laser across parts of the layer 514, 515, using photolithography, using contact-based or scanning laser heating, etc.).

In a variation on the fifth and sixth examples the substrate 120 may be formed from a material which changes its stretchiness when exposed to light, UV or heat respectively (where the light or UV or heat, or any combination thereof, may cause the stretchiness to increase or reduce), i.e. instead of such a material being used to coat another material as in the fifth and sixth examples. Again the exposure may be implemented in any suitable way (e.g. by scanning a laser across parts of the material, using photolithography, using contact-based or scanning laser heating, etc.).

The change in properties of the additional layer 514, 515 may be permanent or may only occur during exposure (e.g. when illuminated or heated). Substrates 120 where the differential stretchiness is only present during exposure to heat or light or UV may be used where the stretching occurs during manufacture of the display but are not suitable for use where the stretching occurs during use.

The processing described above to form the substrate 120 having regions of different stretchiness may be performed through pre-processing (i.e. before the formation of pixels 102 on or in the substrate or before the application of pixels 102 to the substrate 120) or through post-processing (i.e. after the formation of pixels 102 on or in the substrate or after the application of pixels 102 to the substrate 120).

In examples where the substrate 120 has regions of different thickness (e.g. in examples 501, 505, 506) and where these regions are formed prior to the pixels 102, the substrate 120 may be placed on a support structure during processing to form or apply the pixels 102 in order that the top surface 120 is flat.

Although in the examples described above, the substrate 120 comprises regions which are less elastic than the surrounding parts of the substrate, in various examples, these less elastic regions may also be less flexible than the surrounding parts of the substrate or additional less flexible regions may be provided (e.g. using any of the techniques described above with reference to FIG. 5) which may be separate from or may partially overlap the less elastic regions. Where the control elements 106 of each autonomous pixel are located in a region which is both less elastic and less flexible, the control element 106 is protected against damage if the display is stretched and/or flexed (e.g. in manufacture and/or in use). In various examples, the display may be stretched in manufacture (e.g. when vacuum formed) and flexed in use (e.g. by a user).

Although the examples described above show a single display element 104 in each pixel (where this display element may comprise a discrete element or be part of a larger film or layer of display material) such that there is a 1:1 relationship between pixels and display elements 104, in various examples, there may be more than one display element 104 in a pixel and the state of all the display elements 104 may be controlled together based on the output of the single sensing element (within the control element 106). In further examples there may be more sensors than pixels where these sensors (within a pixel) may be the same or different.

In the examples described above each pixel operates autonomously, such that the state (e.g. color) of a display element is affected only by the external stimulus detected by the sensing element 108 in that particular pixel and any processing performed on the output of the sensing element in the pixel controller 112 and/or pixel driver 110 in the pixel (although there may be a global sensitivity or other setting provided to each pixel via a global connection). There is no influence of one pixel on adjacent pixels (each one operates identically but independently) and control signals are therefore generated locally on a per-pixel basis (and so the identical operation may lead to different colors of the display elements).

In a variation on the examples described above, a pixel may be influenced by its neighbor pixels such that the control signal to drive the display element is based on the external stimulus sensed locally (i.e. within the pixel) and in addition also on the external stimulus sensed by one or more proximate pixels. For example, the control sample may be based on the external stimulus sensed locally and the external stimulus sensed by those pixels which are immediately adjacent to the particular pixel.

Although the present examples are described and illustrated herein as being implemented in a display as shown in FIG. 1 with circular pixels, the system described is provided as an example and not a limitation. As those skilled in the art will appreciate, the present examples are suitable for application in a variety of different types of display systems and different shaped pixels may be used (e.g. triangular, square, hexagonal or irregular shaped pixels such as where the pixels are arranged according to a Voronoi tessellation). The display system may be planar or curved and as described above may be a non-developable surface. Some displays may comprise a small number of pixels (e.g. tens of pixels) and other displays may comprise a very large number of pixels (e.g. from many thousands to many millions of pixels). In many examples the pixel size may be very small (e.g. such that the display has a resolution of 300 pixels-per-inch or more); however, in other examples, much larger pixel sizes (e.g. pixel diameters of several millimeters or centimeters) may be used.

Using the autonomous pixels described herein, displays may be fabricated with pixels in any arrangement and on surfaces of any complexity (as long as the manufacturing process can fabricate the signal and power stack onto it). In examples where random or pseudo-random pixel placement is used, the display will not suffer from moiré or other aliasing artifacts which standard rectilinear pixel arrangements experience.

The autonomous pixels described herein may be used to create displays of any size and shape and these displays may be used for any application. As described above, the display may be stretched during manufacture (e.g. to take a required shape or form) and/or the display may be stretchable by a user (i.e. in use). In various examples, the display may additionally be flexed during manufacture and/or flexible in use. Example applications include, but are not limited to, displays on highly contoured or irregular surfaces (e.g. on the exterior of a vehicle or other object), wearable devices (e.g. as part of a piece of clothing that includes a display and needs to stretch, e.g. for user comfort or so that the piece of clothing can be put on and taken off), inflatable architecture, animated sculptures, signage, packaging, upholstery, toys, game pieces or cards, etc.

Many different fabrication methods or techniques may be used to make a display comprising the autonomous pixels described herein including, but not limited to, roll-to-roll methods, laser cutting, vacuum forming, robot placement of pixels and spray placement of pixels.

Figure 3:
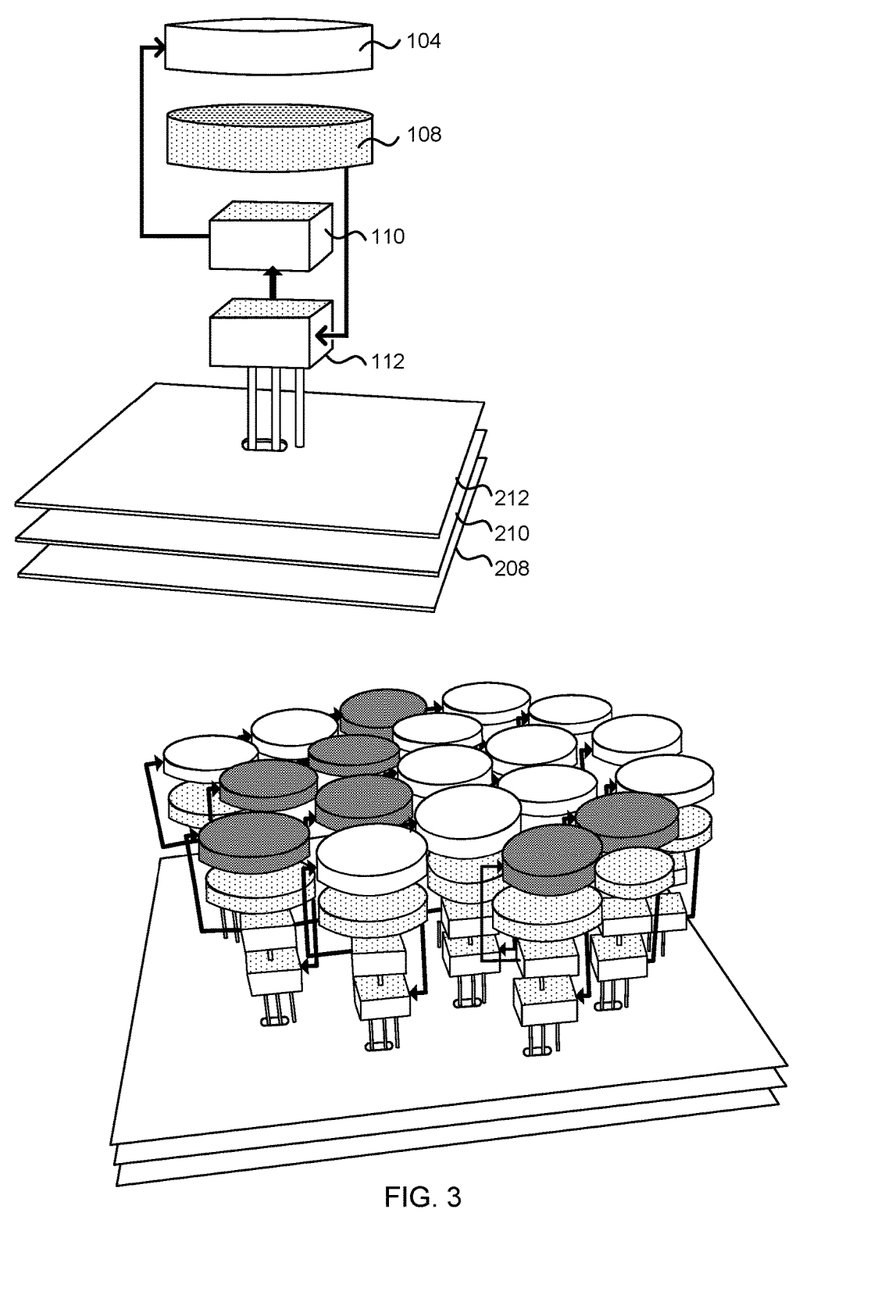
FIG. 3 shows example perspective views of an autonomous pixel and a display comprising a plurality of autonomous pixels.

The global power plane 208, global ground plane 210 and optional global signal plane 212 as shown in FIG. 3 enable the use of roll-to-roll fabrication processes for displays comprising the autonomous pixels and stretchable substrate 120 described herein if the substrate 120 is flexible (as well as stretchable). In some examples (e.g. the first two examples 501, 502 in FIG. 5); although the stretchable layer 510 may be flexible, the additional structure 511, 512 may not be and where the additional structure 511, 512 is not flexible, roll-to-roll fabrication processes may be used prior to the addition of the additional structure 511, 512. For example, where the additional structure is added as a post-processing step, roll-to-roll fabrication processes may be used prior to this to form the autonomous pixels 102 in or on the uniformly stretchable layer 510.

Use of roll-to-roll fabrication, as described above, enables long lengths of display material comprising the autonomous pixels to be formed (which may, for example, be many meters or hundreds of meters long) and then subsequently, the display material may be cut into displays of any shape or size, with each display comprising a plurality of the autonomous pixels. The displays which are cut from the display material may be all the same shape and size or of different shape and/or size and all contacts may be provided on the underside of the display material (i.e. the opposite face to the display face 204). For example, a complex non-planar display may be formed by cutting (e.g. laser cutting) the net of the desired shape from a roll of display material and then folding (or otherwise forming) it into the 3D shape. Alternatively, non-planar displays may be formed from several pieces cut from the roll of display material which are then butted against each other (e.g. to form a display on a non-developable surface) and contact may be made to the underside of each piece of display material (e.g. to provide the global ground and power connections). In such examples, the pieces may be joined together in any way (e.g. by gluing or sewing the pieces together). The roll of display material may, for example, be used to fabricate a piece of clothing by cutting multiple pieces and sewing, gluing or bonding them together to form a wearable display comprising a plurality of autonomous pixels.

The display as described above may alternatively be stretched during manufacture (e.g. it may be vacuum-formed or thermoformed) to produce a non-planar display. The use of a substrate 120 which has regions of differential stretchiness protects the electronic components within an autonomous pixel 102 from damage during stretching and/or maintains the relative spatial positioning of the components within an autonomous pixel.

Other fabrication processes for displays comprising the autonomous pixels described herein may alternatively be used, including robot placement of pixels, spray placement of pixels or application of pixels by sprinkling, diffusion, etc. Use of spray placement, sprinkling or diffusion of pixels enables random (e.g. stochastic) placement of pixels and use of robot placement enables the pixels to be positioned in any pre-defined pattern which may, for example, be regular or pseudo-random (e.g. dependent upon the programming of the robot performing the pixel placement). In an example, the display substrate 120 may be passed through a container comprising a plurality of pixel elements such that at the input of the container, there are no pixel elements on the display substrate 120 and at the output of the container there are many pixel elements on the substrate 120.

Although in the examples described above, there is always a global power plane 208, in further examples, each pixel 102 may comprise a power harvesting element (which may for example be part of the control element 106) and in such examples the global power plane 208 may be omitted. In other examples where power harvesting is used, there may be no global electrical planes (e.g. where an expose or trigger signal may be provided through other means, such as optically).

A first further example provides a display comprising a plurality of autonomous pixels on a stretchable substrate, an autonomous pixel comprising a display element and a control element arranged to sense an external stimulus and to generate, entirely within the autonomous pixel, a control signal to drive the display element based, at least in part, on a magnitude of the sensed external stimulus and the stretchable substrate comprising a plurality of less elastic regions separated by stretchable areas, wherein the less elastic regions are less stretchable than the surrounding stretchable areas, and wherein each control element of an autonomous pixel is located in or on a less elastic region of the stretchable substrate.

A second further example provides a display comprising a plurality of autonomous pixels on a stretchable substrate, an autonomous pixel comprising a display element and means for sensing an external stimulus and means for generating, entirely within the autonomous pixel, a control signal to drive the display element based, at least in part, on a magnitude of the sensed external stimulus and the stretchable substrate comprising a plurality of less elastic regions separated by stretchable areas, wherein the less elastic regions are less stretchable than the surrounding stretchable areas, and wherein the means for generating the control signal of an autonomous pixel is located in or on a less elastic region of the stretchable substrate.

In various examples, the means for sensing an external stimulus and the means for generating a control signal is the control element 106 shown in FIG. 1 and described above and this may, for example, comprise one or more transistors. In various examples, the means for sensing an external stimulus is a sensing element (or sensor) such as the sensing element 108 shown in FIG. 1 and described above. In various examples, the means for generating a control signal is a pixel driver 110 and/or pixel controller 112 as shown in FIG. 1 and described above. In various examples this may comprise one or more transistors.

In the first or second further examples, the display element may also be located in or on a less elastic region of the stretchable substrate.

In the first or second further examples, an entire autonomous pixel may be located in or on a less elastic region of the stretchable substrate.

In the first or second further examples, the stretchable substrate may comprise: a uniformly stretchable layer; and a layer of variable thickness attached to at least one face of the uniformly stretchable layer. The layer of variable thickness may comprise regions of a first thickness separated by areas of a second thickness, wherein the first thickness is greater than the second thickness and the regions of the first thickness correspond to the less elastic regions of the stretchable substrate. The layer of variable thickness may comprise regions with no apertures separated by areas with one or more apertures, wherein the regions with the one or more apertures correspond to the stretchable areas of the stretchable substrate.

In the first or second further examples, the stretchable substrate may comprise: a uniformly stretchable layer; and a layer of variable stretchiness formed from a plurality of different materials with different material properties.

In the first or second further examples, the stretchable substrate may comprise: regions of a first thickness separated by areas of a second thickness, wherein the first thickness is greater than the second thickness and the regions of the first thickness correspond to the less elastic regions of the stretchable substrate.

In the first or second further examples, the stretchable substrate may comprise: a uniformly stretchable layer; and a layer of material which changes stretchiness when exposed to heat, UV or light.

In the first or second further examples, the stretchable substrate may be formed from a material which changes stretchiness when exposed to heat, UV or light.

Any change in stretchiness when exposed to heat, UV or light may be permanent or may only occur when exposed to heat, UV or light, such that the change is reversed when the heat, UV or light is removed.

A third further example provides a method of fabricating a display comprising a plurality of autonomous pixels, the method comprising: forming a stretchable substrate comprising a plurality of less elastic regions separated by stretchable areas, wherein the less elastic regions are less stretchable than the surrounding stretchable areas; and forming a plurality of autonomous pixels on the stretchable substrate, each autonomous pixel comprising a display element and a control element arranged to sense an external stimulus and to generate, entirely within the autonomous pixel, a control signal to drive the display element based, at least in part, on a magnitude of the sensed external stimulus and wherein each control element of an autonomous pixel is located on a less elastic region of the stretchable substrate.

Forming a stretchable substrate may comprise: attaching a layer of variable thickness to at least one face of a uniformly stretchable layer. The layer of variable thickness may comprise regions of a first thickness separated by areas of a second thickness, wherein the first thickness is greater than the second thickness and the regions of the first thickness correspond to the less elastic regions of the stretchable substrate. The layer of variable thickness may comprise regions with no apertures separated by areas with one or more apertures, wherein the regions with the one or more apertures correspond to the stretchable areas of the stretchable substrate.

Forming a stretchable substrate may comprise: selectively removing material from at least one face of a uniformly stretchable layer (510) to form a layer of variable thickness comprising regions of a first thickness separated by areas of a second thickness, wherein the first thickness is greater than the second thickness and the regions of the first thickness correspond to the less elastic regions of the stretchable substrate.

Forming a stretchable substrate may comprise: applying a layer of material to a uniformly stretchable layer, wherein the material changes stretchiness when exposed to heat, UV or light; and selectively exposing regions of the material to form the less elastic regions separated by stretchable areas.

The stretchable substrate may be formed from a material which changes stretchiness when exposed to heat, UV and/or light.

A fourth further example provides a method of fabricating a display comprising a plurality of autonomous pixels, the method comprising: forming a plurality of autonomous pixels on a uniformly stretchable layer, each autonomous pixel comprising a display element and a control element arranged to sense an external stimulus and to generate, entirely within the autonomous pixel, a control signal to drive the display element based, at least in part, on a magnitude of the sensed external stimulus; and adding material to or removing material from the uniformly stretchable layer to form a plurality of less elastic regions separated by stretchable areas, wherein the less elastic regions are less stretchable than the surrounding stretchable areas and wherein each control element of an autonomous pixel is located on a less elastic region of the stretchable substrate.

The method of the fourth further example may be performed by one or more devices (e.g. as part of a manufacturing line).

Adding material to or removing material from the uniformly stretchable layer may comprise: attaching a layer of variable thickness to at least one face of a uniformly stretchable layer. The layer of variable thickness may comprise regions of a first thickness separated by areas of a second thickness, wherein the first thickness is greater than the second thickness and the regions of the first thickness correspond to the less elastic regions of the stretchable substrate. The layer of variable thickness may comprise regions with no apertures separated by areas with one or more apertures, wherein the regions with the one or more apertures correspond to the stretchable areas of the stretchable substrate.

Adding material to or removing material from the uniformly stretchable layer may comprise: selectively removing material from at least one face of the uniformly stretchable layer to form a layer of variable thickness comprising regions of a first thickness separated by areas of a second thickness, wherein the first thickness is greater than the second thickness and the regions of the first thickness correspond to the less elastic regions of the stretchable substrate.

Adding material to or removing material from the uniformly stretchable layer may comprise: applying a layer of material to the uniformly stretchable layer, wherein the material changes stretchiness when exposed to heat, UV or light; and selectively exposing regions of the material to form the less elastic regions separated by stretchable areas.

The term 'computer' or 'computing-based device' is used herein to refer to any device with processing capability such that it can execute instructions. Those skilled in the art will realize that such processing capabilities are incorporated into many different devices and therefore the terms 'computer' and 'computing-based device' each include PCs, servers, mobile telephones (including smart phones), tablet computers, set-top boxes, media players, games consoles, personal digital assistants and many other devices.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

The term 'subset' is used herein to refer to a proper subset such that a subset of a set does not comprise all the elements of the set (i.e. at least one of the elements of the set is missing from the subset).

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A display comprising:
a plurality of autonomous pixels on a stretchable substrate, at least one of the plurality of pixels comprising:
a display element and
a control element arranged to sense an external stimulus and to generate a control signal to drive the display element based, at least in part, on a magnitude of the sensed external stimulus and the stretchable substrate comprising a plurality of less elastic regions separated by stretchable areas,
wherein the less elastic regions are less stretchable than the surrounding stretchable areas, and wherein the control element is located in or on one of the less elastic regions of the stretchable substrate.

2. A display according to claim 1, wherein the stretchable substrate comprises:
a uniformly stretchable layer; and
a layer of variable thickness attached to at least one face of the uniformly stretchable layer.

3. A display according to claim 2, wherein the layer of variable thickness comprises regions of a first thickness separated by areas of a second thickness, wherein the first thickness is greater than the second thickness and the regions of the first thickness correspond to the less elastic regions of the stretchable substrate.

4. A display according to claim 2, wherein the layer of variable thickness comprises regions with no apertures separated by areas with one or more apertures, wherein the regions with the one or more apertures correspond to the stretchable areas of the stretchable substrate.

5. A display according to claim 1, wherein the stretchable substrate comprises:
a uniformly stretchable layer; and
a layer of variable stretchiness formed from a plurality of different materials with different material properties.

6. A display according to claim 1, wherein the stretchable substrate comprises regions of a first thickness separated by areas of a second thickness, wherein the first thickness is greater than the second thickness and the regions of the first thickness correspond to the less elastic regions of the stretchable substrate.

7. A display according to claim 1, wherein the stretchable substrate comprises:
a uniformly stretchable layer; and
a layer of material which changes stretchiness when exposed to heat, UV or light.

8. A display according to claim 1, wherein the stretchable substrate is formed from a material which changes stretchiness when exposed to heat, UV or light.

9. A method of fabricating a display comprising a plurality of pixels, the method comprising:
forming a stretchable substrate comprising a plurality of less elastic regions separated by stretchable areas, wherein the less elastic regions are less stretchable than the surrounding stretchable areas; and
forming a plurality of pixels on the stretchable substrate, at least one of the plurality of pixels comprising a display element and a control element arranged to sense an external stimulus and to generate a control signal to drive the display element based, at least in part, on a magnitude of the sensed external stimulus and wherein the control element is located in or on one of the less elastic regions of the stretchable substrate.

10. A method according to claim 9, wherein forming a stretchable substrate comprises:
attaching a layer of variable thickness to at least one face of a uniformly stretchable layer.

11. A method according to claim 10, wherein the layer of variable thickness comprises regions of a first thickness separated by areas of a second thickness, wherein the first thickness is greater than the second thickness and the regions of the first thickness correspond to the less elastic regions of the stretchable substrate.

12. A method according to claim 10, wherein the layer of variable thickness comprises regions with no apertures separated by areas with one or more apertures, wherein the regions with the one or more apertures correspond to the stretchable areas of the stretchable substrate.

13. A method according to claim 10, wherein forming a stretchable substrate comprises:
selectively removing material from at least one face of a uniformly stretchable layer to form a layer of variable thickness comprising regions of a first thickness separated by areas of a second thickness, wherein the first thickness is greater than the second thickness and the regions of the first thickness correspond to the less elastic regions of the stretchable substrate.

14. A method according to claim 10, wherein forming a stretchable substrate comprises:
applying a layer of material to a uniformly stretchable layer, wherein the material changes stretchiness when exposed to heat, UV or light; and selectively exposing regions of the material to form the less elastic regions separated by stretchable areas.

15. A method of fabricating a display comprising a plurality of pixels, the method comprising:

forming a plurality of pixels on a uniformly stretchable layer, at least one of the plurality of pixels comprising a display element and a control element arranged to sense an external stimulus and to generate a control signal to drive the display element based, at least in part, on a magnitude of the sensed external stimulus; and adding material to or removing material from the uniformly stretchable layer to form a plurality of less elastic regions separated by stretchable areas, wherein the less elastic regions are less stretchable than the surrounding stretchable areas and wherein the control element is located in or on one of the less elastic regions of the stretchable substrate.

16. A method according to claim 15, wherein adding material to or removing material from the uniformly stretchable layer comprises:

attaching a layer of variable thickness to at least one face of a uniformly stretchable layer.

17. A method according to claim 16, wherein the layer of variable thickness comprises regions of a first thickness separated by areas of a second thickness, wherein the first thickness is greater than the second thickness and the regions of the first thickness correspond to the less elastic regions of the stretchable substrate.

18. A method according to claim 16, wherein the layer of variable thickness comprises regions with no apertures separated by areas with one or more apertures, wherein the regions with the one or more apertures correspond to the stretchable areas of the stretchable substrate.

19. A method according to claim 15, wherein adding material to or removing material from the uniformly stretchable layer comprises:

selectively removing material from at least one face of the uniformly stretchable layer to form a layer of variable thickness comprising regions of a first thickness separated by areas of a second thickness, wherein the first thickness is greater than the second thickness and the regions of the first thickness correspond to the less elastic regions of the stretchable substrate.

20. A method according to claim 15, wherein adding material to or removing material from the uniformly stretchable layer comprises:

applying a layer of material to the uniformly stretchable layer, wherein the material changes stretchiness when exposed to heat, UV and/or light; and selectively exposing regions of the material to form the less elastic regions separated by stretchable areas.

* * * * *